United States Patent
Yu et al.

(10) Patent No.: US 10,186,462 B2
(45) Date of Patent: Jan. 22, 2019

(54) SEMICONDUCTOR DEVICE AND METHOD

(71) Applicant: Taiwan Semiconductor Manufacturing Company, Ltd., Hsinchu (TW)

(72) Inventors: Chen-Hua Yu, Hsinchu (TW); Hui-Jung Tsai, Hsinchu (TW); Yun Chen Hsieh, Baoshan Township (TW); Hung-Jui Kou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/640,942

(22) Filed: Jul. 3, 2017

(65) Prior Publication Data

US 2018/0151453 A1    May 31, 2018

Related U.S. Application Data

(60) Provisional application No. 62/427,693, filed on Nov. 29, 2016.

(51) Int. Cl.
| | |
|---|---|
| H01L 21/66 | (2006.01) |
| H01L 21/56 | (2006.01) |
| H01L 21/768 | (2006.01) |
| H01L 23/00 | (2006.01) |
| H01L 25/065 | (2006.01) |
| H01L 23/31 | (2006.01) |

(52) U.S. Cl.
CPC .............. *H01L 22/14* (2013.01); *H01L 21/56* (2013.01); *H01L 21/76885* (2013.01); *H01L 24/11* (2013.01); *H01L 25/0657* (2013.01); *H01L 21/568* (2013.01); *H01L 23/3128* (2013.01); *H01L 24/45* (2013.01); *H01L 2224/45144* (2013.01); *H01L 2224/45147* (2013.01); *H01L 2224/48091* (2013.01); *H01L 2224/48227* (2013.01); *H01L 2924/19107* (2013.01)

(58) Field of Classification Search
USPC .......................................................... 438/16
See application file for complete search history.

(56) References Cited

U.S. PATENT DOCUMENTS

| | | | |
|---|---|---|---|
| 6,291,891 B1* | 9/2001 | Higashi ................. | H01L 21/288 |
| | | | 257/750 |
| 9,595,482 B2* | 3/2017 | Chen ..................... | H01L 23/481 |
| 2015/0152366 A1* | 6/2015 | Shimada ........... | H01L 21/02063 |
| | | | 438/618 |
| 2015/0311144 A1* | 10/2015 | Williams ............ | H01L 23/4952 |
| | | | 257/675 |
| 2016/0276235 A1* | 9/2016 | Chen ..................... | H01L 23/481 |
| 2017/0062291 A1* | 3/2017 | Arvin ..................... | H01L 22/32 |
| 2017/0271283 A1* | 9/2017 | Lee ......................... | H01L 24/02 |

* cited by examiner

*Primary Examiner* — Marcos D Pizarro Crespo
*Assistant Examiner* — Lawrence C Tynes, Jr.
(74) *Attorney, Agent, or Firm* — Slater Matsil, LLP

(57) ABSTRACT

A semiconductor device and method includes forming a conductive post on a die; coupling a test probe to the conductive post with solder; and etching the solder and the conductive post with a plurality of etching processes, the plurality of etching processes including a first etching process, the first etching process comprising etching the conductive post with a nitric-based etchant.

21 Claims, 10 Drawing Sheets

SEMICONDUCTOR DEVICE AND METHOD

PRIORITY CLAIM AND CROSS-REFERENCE

This application claims the benefit of U.S. Provisional Application No. 62/427,693, filed on Nov. 29, 2016, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
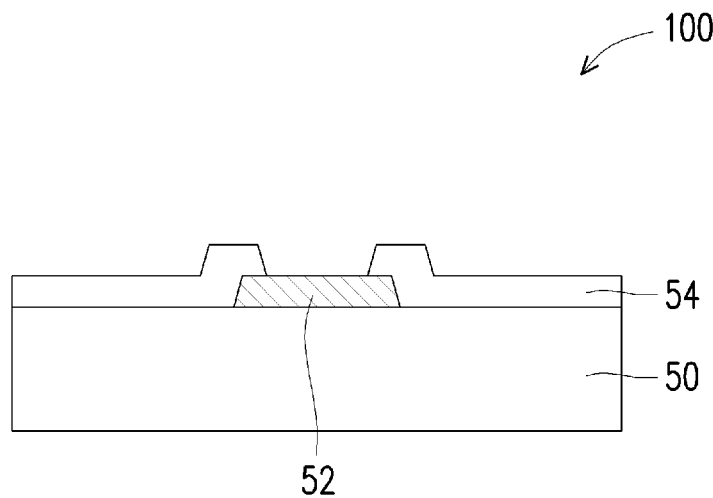
FIGS. 1 through 9 are cross-sectional views of intermediate steps during a process for forming and testing a die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method are provided in accordance with various embodiments. In particular, a conductive feature is formed on an integrated circuit device, and a test structure is coupled to the conductive feature with solder. After testing, the solder is removed from the conductive feature by etching the solder and the conductive feature with a nitric-based etchant. The etching may remove the solder from the conductive feature, and may reduce delamination of an encapsulant from the sidewalls and/or top surface of the conductive feature in subsequent processing steps. In particular, the nitric-based etchant may clean the surface of the conductive feature such that delamination is reduced or eliminated when the conductive feature and integrated circuit device are encapsulated with an encapsulant such as a low temperature polyimide (LTPI). Some variations of the embodiments are discussed. One of ordinary skill in the art will readily understand other modifications that may be made that are contemplated within the scope of other embodiments.

FIGS. 1 through 9 are cross-sectional views of intermediate steps during a process for forming and testing a die 100, in accordance with some embodiments. The die 100 may include a logic die, such as a central processing unit (CPU), a graphics processing unit (GPU), the like, or a combination thereof. In some embodiments, the die 100 include a die stack (not shown) which may include both logic dies and memory dies. The die 100 may include an input/output (I/O) die, such as a wide I/O die that provides a connection between a first package and a subsequently attached second package.

In FIG. 1, the die 100 is shown at an intermediate stage of processing including a substrate 50, pads 52, and a passivation film 54. Before the step shown in FIG. 1, the die 100 may be processed according to applicable manufacturing processes to form an integrated circuit in the die 100, forming an integrated circuit die.

The substrate 50 may include a bulk semiconductor substrate, a semiconductor-on-insulator (SOI) substrate, multi-layered or gradient substrates, or the like. The semiconductor of the substrate 50 may include any semiconductor material, such as elemental semiconductor like silicon, germanium, or the like; a compound or alloy semiconductor including SiC, GaAs, GaP, InP, InAs, indium antimonide, SiGe, GaAsP, AlInAs, AlGaAs, GaInAs, GaInP, and/or GaInAsP; the like; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the die 100. The integrated circuit devices may be formed using any suitable methods.

The substrate 50 may also include an interconnect structure (not shown). The interconnect structure may be formed over the integrated circuit devices and are designed to connect the various integrated circuit devices to form functional circuitry. The interconnect structure may be formed of alternating layers of dielectric (e.g., low-k dielectric material) and conductive material (e.g., copper) and may be formed through any suitable process (such as deposition, damascene, dual damascene, etc.). The conductive and dielectric layers may include metal lines and vias (not shown) to electrically couple the integrated circuit devices to the pads 52. Only a portion of the substrate 50 is illustrated in the figures, as this is sufficient to fully describe the illustrative embodiments.

The pads 52 are over the substrate 50. The pads 52 may be formed over and in electrical contact with the interconnect structure in the substrate 50 (not shown), in order to help provide external connections to the integrated circuit devices. The pads 52 are on what may be referred to as an active side of the die 100. In some embodiments, the pads 52 are formed by forming recesses (not shown) into a dielectric layer (not shown) or the substrate 50. The recesses may be formed to allow the pads 52 to be embedded into the dielectric layer and/or substrate 50. In other embodiments, the recesses are omitted as the pads 52 may be formed on the dielectric layer or substrate 50. The pads 52 may include a thin seed layer (not shown) made of copper, titanium, nickel, gold, tin, the like, or a combination thereof. The conductive material of the pads 52 may be deposited over the thin seed layer. The conductive material may be formed by an electrochemical plating process, chemical vapor deposition (CVD), physical vapor deposition (PVD), atomic layer deposition (ALD), the like, or a combination thereof. In an embodiment, the conductive material of the pads 52 is copper, tungsten, aluminum, silver, gold, tin, the like, or a combination thereof. The pads 52 may be formed to have a thickness from about 0.01 μm to about 1.0 μm, such as about 0.3 μm.

One pad 52 is illustrated on the die 100 for clarity and simplicity, and one of ordinary skill in the art will readily understand that more than one pad 52 may be present.

The passivation film 54 is formed on the substrate 50 and over the pad 52. The passivation film 54 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The passivation film 54 may be formed through a process such as CVD, PVD, ALD, a spin-on-dielectric process, the like, or a combination thereof, and may have a thickness from about 0.1 μm to about 10 μm. The thickness the passivation film 54 is formed to may vary based on the material it is formed with. In some embodiments, top surfaces of the pads 52, and a portion of a bottom surface of the passivation film 54 are level.

An opening is formed through the passivation film 54 to expose a portion of the pads 52. The opening may be formed by, for example, etching, milling, laser techniques, the like, or a combination thereof.

Figure 2:
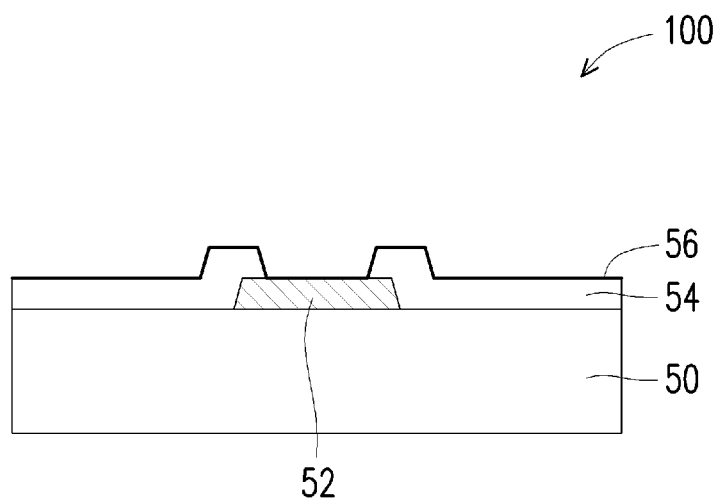

In FIG. 2, a seed layer 56 is formed over the substrate 50, the passivation film 54, and the pad 52. The seed layer 56 directly contacts a top surface of the pad 52 in the opening of the passivation film 54. In some embodiments, the seed layer 56 is a metal layer, which may be a single layer or a composite layer comprising a plurality of sub-layers formed of different materials. The seed layer 56 may be formed of copper, titanium, nickel, gold, the like, or a combination thereof. In some embodiments, the seed layer 56 includes a titanium layer and a copper layer over the titanium layer. The seed layer 56 may be formed using, for example, PVD or the like.

Figure 3:
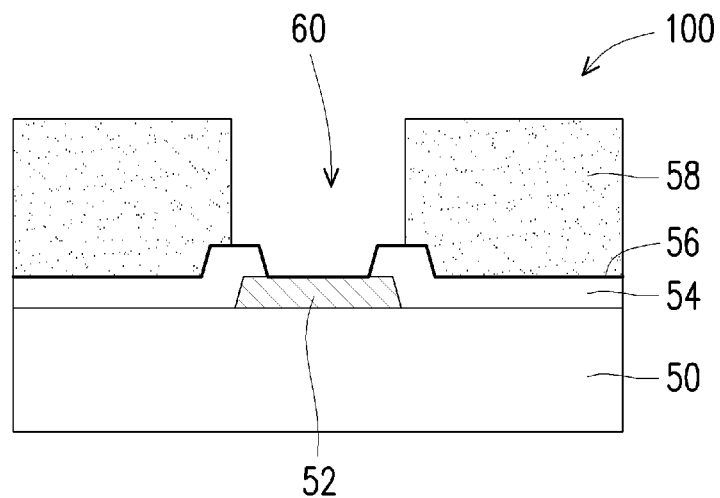

In FIG. 3, a photo resist 58 is formed and patterned over the seed layer 56. In some embodiments, the photo resist 58 is formed and patterned on the seed layer 56 and then conductive features are formed in the patterned photo resist 58 (discussed below in FIG. 4). The photo resist 58 may be formed by a wet process, such as a spin-on process, or by a dry process, such as by applying a dry film. Openings 60 may be formed in the photo resist 58 to expose the underlying seed layer 56.

Figure 4:
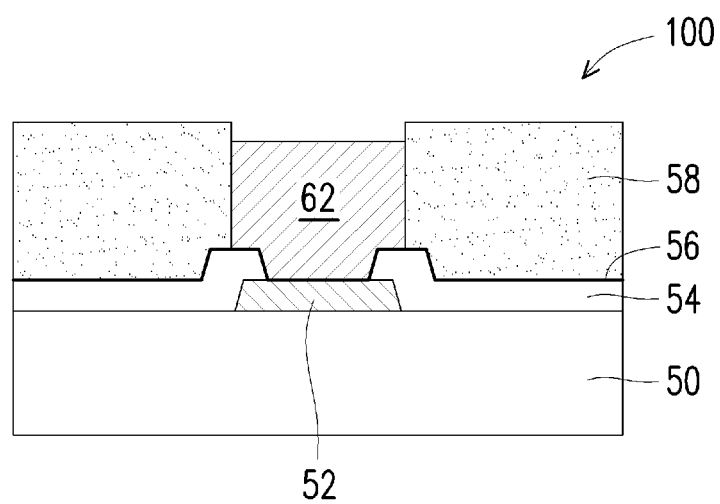

In FIG. 4, conductive feature 62 is formed in the opening 60. The conductive feature 62 is shown in FIG. 4 as having a flat top surface, but it should be appreciated that the top surface could be other shapes, such as a convex top surface or a concave top surface. The shape/profile of the top surface of the conductive feature 62 may be controlled by the parameters of the process utilized to form the conductive feature 62. In some embodiments, the conductive feature 62 is formed by plating, such as electroplating or electroless plating, or the like. The conductive feature 62 may be formed of a metal, like copper, aluminum, nickel, gold, silver, palladium, tin, the like, or a combination thereof, and may have a composite structure including a plurality of layers. In some embodiments, additive chemicals known as accelerators, suppressors, and levelers may be added to the plating solution based on the configuration of the conductive features.

Figure 5:
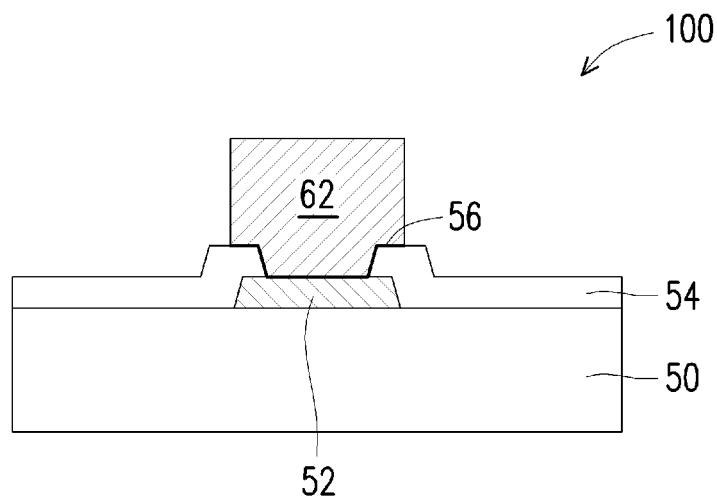

In FIG. 5, the photo resist 58 is removed, and portions of the seed layer 56 outside of the conductive feature 62 are removed. The photo resist 58 and the seed layer 56 may be removed through suitable removal processes such as ashing, etch processes, the like, or a combination thereof.

Figure 6:
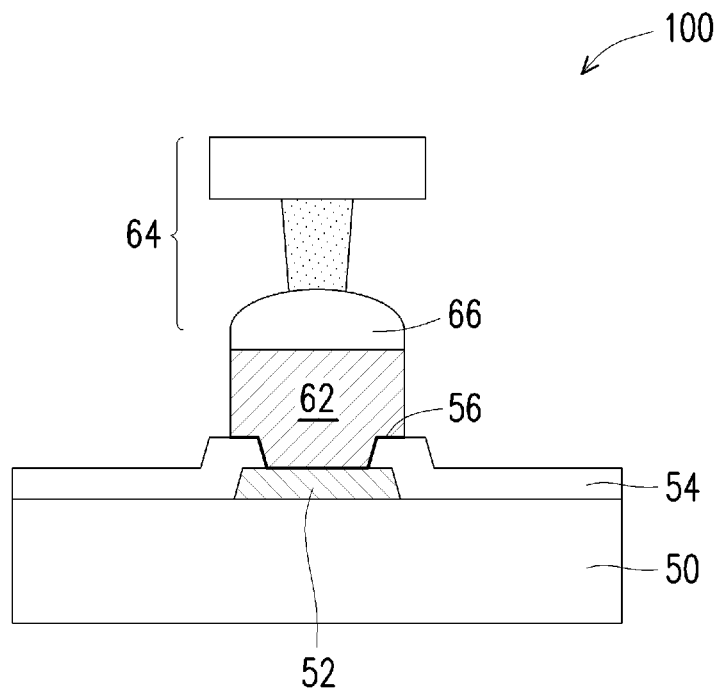

In FIG. 6, the die 100 is tested during processing using a test structure 64 with a probe contact. The testing may be performed in-situ with the formation of the die 100 and may allow for the yield of the die 100 to be monitored. The probe contact of the test structure 64 is coupled to the conductive feature 62 with a solder cap 66. The solder cap 66 is formed on the top surface of the conductive feature 62 by initially forming a layer of solder through such commonly used methods such as evaporation, electroplating, printing, solder transfer, ball placement, or the like. Once a layer of solder has been formed on the conductive feature 62, a reflow may be performed in order to reflow the solder and form the solder cap 66 physically and electrically coupling the conductive feature 62 to the test structure 64. An intermetallic compound (IMC) (not shown) may form between the solder cap 66 and the conductive feature 62 during reflow. Once the conductive feature 62 is coupled to the test structure 64, the die 100 is tested. Further processing may be halted in response to the die 100 failing testing.

Figure 7:
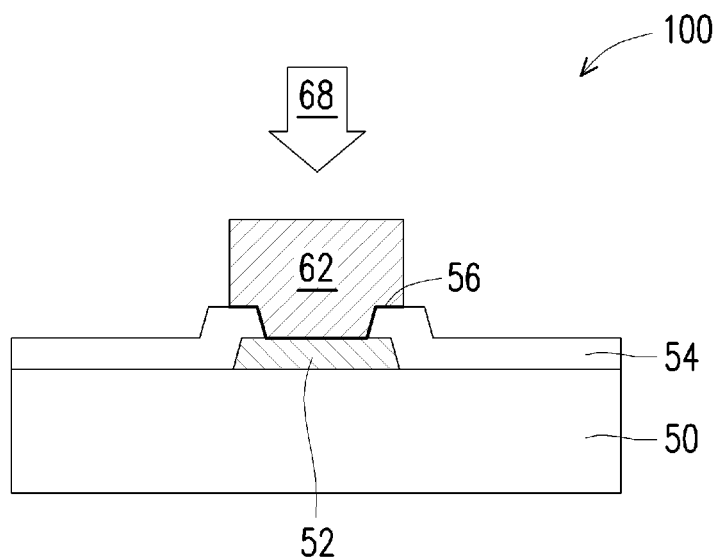

In FIG. 7, the test structure 64 is decoupled from the conductive feature 62. The solder cap 66 is removed with a selective etching process 68. The selective etching process 68 is selective to the material of the solder cap 66. In an embodiment, the conductive feature 62 is formed from Cu, and the selective etching process 68 is a wet etching process that uses a nitric-based etchant. The nitric-based etchant may be nitric acid that includes an ion of a transition metal such as V, Cr, Mn, or Fe. The concentration of the transition metal ion in the nitric acid may be from about 0.1% to about 10%. The ion of the transition metal modulates the selectivity of the etching chemistry such that the selective etching process 68 removes the IMC and the solder cap 66 without significantly damaging exposed surfaces of the conductive feature 62. In embodiments where the conductive feature 62 is formed from Cu, damage to the exposed surfaces may be reduced due to the difference in reduction (redox) potential between the Cu of the conductive feature 62 and tin of the solder cap 66. The transition metal acts as an oxidant for the solder cap 66 such that the tin of the solder cap 66 forms a salt with the nitric acid, but the Cu of the conductive feature 62 does not form a salt or forms less salt than the tin of the solder cap 66. Use of the selective etching process 68 to remove solder from a Cu pillar may result in less surface damage than traditional solder removal etching processes. The selective etching process 68 may be a single-step etching process that also cleans the exposed surfaces of the conductive feature 62. In some embodiments, the selective etching process 68 includes a plurality of etching processes, one of which includes use of the nitric-based etchant, and others of which include additional cleaning steps that further improve the cleaning of the surfaces of the conductive feature 62. Use of the nitric-based etchant and the optional additional cleaning steps may also improve the amount of solder removed from the conductive feature 62.

When forming the solder cap 66, reflowing the solder may form voids along the conductive feature 62 in a future encapsulation step (discussed below), and may cause solder wetting along sidewalls of the conductive feature 62. The nitric-based etchant may remove the solder from the sidewalls of the conductive feature 62 and reduce or eliminate the quantity of voids.

Figure 8:
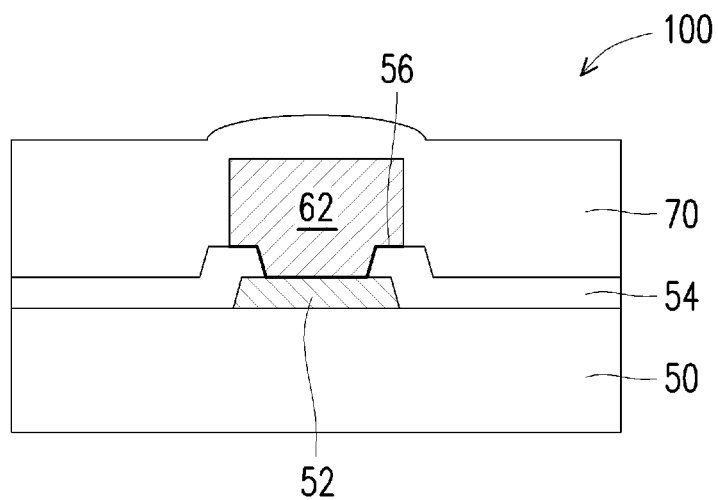

In FIG. 8, a dielectric material 70 is formed on the active side of the die 100, such as on the passivation film 54 and the conductive feature 62. The dielectric material 70 may encapsulate the conductive feature 62. In some embodiments, the dielectric material 70 is laterally coterminous with the die 100. The dielectric material 70 may be a polymer, such as polybenzoxazole (PBO), polyimide, benzocyclobutene (BCB), or the like. In other embodiments, the dielectric material 70 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric material 70 may be formed by any acceptable deposition process, such as spin coating, CVD, laminating, the like, or a combination thereof. After formation, the dielectric material 70 buries the conductive feature 62.

In an embodiment, the dielectric material 70 is a LTPI. Removing the solder cap 66 from the conductive feature 62 and cleaning the conductive feature 62 with a nitric-based etchant may improve the interface between the LTPI and the conductive feature 62. In particular, performing cleaning and removal of the solder cap 66 with a nitric-based etchant may reduce delamination that otherwise occurs at the interface between the dielectric material 70 and the conductive feature 62 when solder remains on the conductive feature 62. Reducing delamination may improve the adhesion between the dielectric material 70 and the conductive feature 62.

Figure 9:
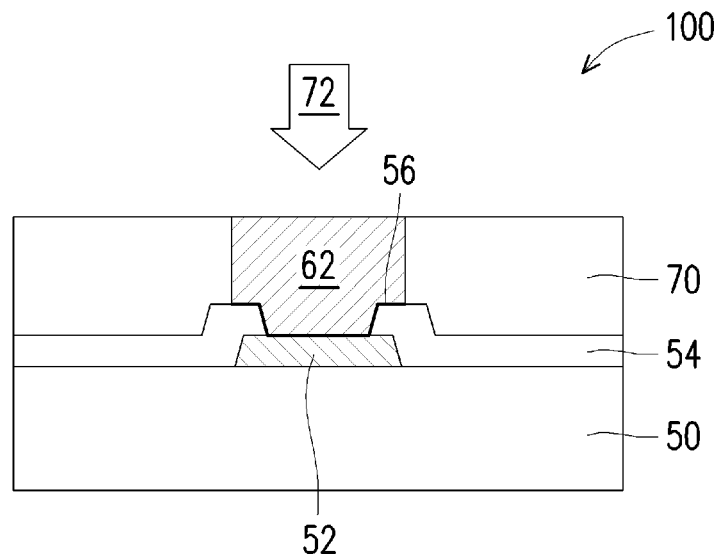

In FIG. 9, a planarization step 72, such as a grinding or a chemical-mechanical planarization (CMP), may be performed on the dielectric material 70. The planarization step 72 is used to remove excess portions of the dielectric material 70, which excess portions are over the top surface of the conductive feature 62. In some embodiments, top surfaces of the conductive feature 62 are exposed and planarized, and are level with a top surface of the dielectric material 70. In some embodiments, the planarization step 72 is omitted. In such embodiments (discussed below with respect to FIGS. 17 through 18), excess portions of the dielectric material 70 may be left remaining over the top surface of the conductive feature 62 and removed in a subsequent planarization step. As illustrated, the conductive feature 62 extends to the top surface of the dielectric material 70 and may be used as a via to the next conductive layer, such as a redistribution layer (RDL) (discussed below in FIG. 13) and may be referred to as a conductive via 62 hereinafter. Further, the conductive feature 62 is embedded within the dielectric material 70 and is isolated from the next conductive layer (see FIG. 9). The conductive feature 62 may also be referred to a pillar or a microbump.

Figure 10:
FIGS. 10 through 15 are cross-sectional views of intermediate steps during a process for forming a first device package, in accordance with some embodiments.

FIGS. 10 through 15 are cross-sectional views of intermediate steps during a process for forming a first device package 200, in accordance with some embodiments. In FIG. 10, the first device package 200 includes a carrier substrate 102, and a dielectric layer 104 over the carrier substrate 102.

The carrier substrate 102 may be any suitable substrate that provides (during intermediary operations of the fabrication process) mechanical support for the layers over the carrier substrate 102. The carrier substrate 102 may be a wafer including glass, silicon (e.g., a silicon wafer), silicon oxide, a metal plate, a ceramic material, or the like.

An adhesive layer (not shown) may adhere the carrier substrate 102 to the dielectric layer 104. The adhesive layer may be disposed, for example, laminated, on the carrier substrate 102. The adhesive layer may be formed of a glue, such as an ultra-violet (UV) glue which loses its adhesive property when exposed to UV lights, a light-to-heat conversion (LTHC) material which loses its adhesive property when heated, or the like. The adhesive layer may be dispensed as a liquid and cured, may be a laminate film laminated onto the carrier substrate 102, or may be the like. The top surface of the adhesive layer may be leveled and may have a high degree of coplanarity.

The dielectric layer 104 is formed over the adhesive layer and the carrier substrate 102. The dielectric layer 104 may be silicon nitride, silicon carbide, silicon oxide, low-k dielectrics such as carbon doped oxides, extremely low-k dielectrics such as porous carbon doped silicon dioxide, a polymer, such as an epoxy, polyimide, BCB, PBO, the like, or a combination thereof, although other relatively soft, often organic, dielectric materials can also be used. The dielectric layer 104 may be deposited by CVD, PVD, ALD, a spin-on-dielectric process, the like, or a combination thereof.

In some embodiments, the dielectric layer 104 may be a backside redistribution structure 104. The backside redistribution structure 104 may be formed of alternating layers of dielectric (e.g., low-k dielectric material) and conductive material (e.g., copper) and may be formed through any suitable process (such as deposition, damascene, dual damascene, etc.). The conductive and dielectric layers may include metal lines and vias (not shown).

Further in FIG. 10, electrical connectors 108 may be formed over a seed layer (not shown) and extend from the seed layer in a direction that is substantially perpendicular to a surface of the dielectric layer 104. In embodiments where the dielectric layer 104 is a back side redistribution structure, the electrical connectors 108 are physically and electrically coupled to the backside redistribution structure 104.

In some embodiments, the electrical connectors 108 are formed by a plating process. In these embodiments, the electrical connectors 108 are made of copper, aluminum, nickel, gold, silver, palladium, tin, the like, or a combination thereof, and may have a composite structure including a plurality of layers. In these embodiments, a photoresist (not shown) may be formed over the carrier substrate 102. In some embodiments, the photoresist is formed and patterned on the seed layer and then the electrical connectors 108 are formed in the patterned photoresist. The photoresist may be formed by a wet process, such as a spin-on process, or by a dry process, such as by applying a dry film. A plurality of openings are formed in the photoresist to expose the underlying seed layer. A plating step is then performed to plate the electrical connectors 108.

In alternative embodiments, the electrical connectors 108 may be stud bumps, which are formed by wire bonding over the dielectric layer 104, and cutting the bond wire with a portion of bond wire left attached to the respective bond ball. For example, the electrical connectors 108 may include a lower portion and an upper portion, wherein the lower portion may be a bond ball (not shown) formed in the wire bonding, and the upper portion may be the remaining bond wire (not shown). The upper portion of the electrical connector 108 may have a uniform width and a uniform shape that are uniform throughout the top part, the middle part, and the bottom part of upper portion. The electrical connectors 108 may be formed of non-solder metallic materials that can be bonded by a wire bonder. In some embodiments, the electrical connectors 108 are made of copper wire, gold wire, the like, or a combination thereof, and may have a composite structure including a plurality of layers. In the wire bonding embodiments, the seed layer and the sacrificial layer may be omitted.

Figure 11:
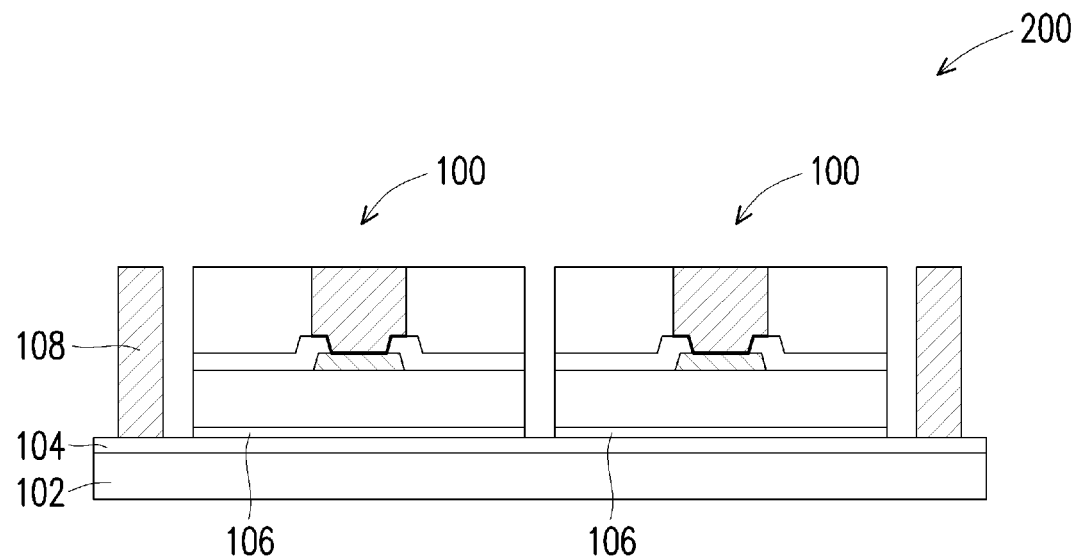

In FIG. 11, the dies 100 are adhered to the dielectric layer 104 with adhesive layers 106. Before being adhered to the dielectric layer 104, the dies 100 may be processed according to applicable manufacturing processes to form integrated circuits in the dies 100 (see FIGS. 1 through 9). The adhesive layer 106 may be any suitable adhesive, such as a die attach film (DAF) or the like.

Figure 12:
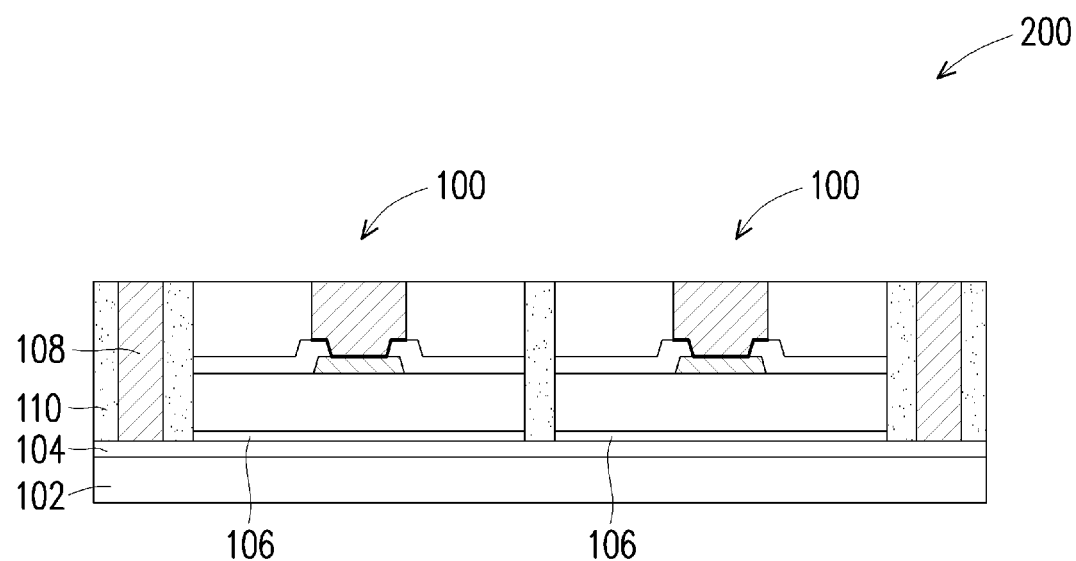

In FIG. 12, the dies 100 and the electrical connectors 108 are encapsulated with a molding material 110. The molding material 110 may be molded on the dies 100 and the electrical connectors 108, for example, using compression molding. In some embodiments, the molding material 110 is made of a molding compound, a polymer, an epoxy, silicon oxide filler material, the like, or a combination thereof. A curing step may be performed to cure the molding material 110, wherein the curing may be a thermal curing, a UV curing, the like, or a combination thereof.

In some embodiments, the dies 100, the conductive vias 62, and the electrical connectors 108 are buried in the molding material 110, and after the curing of the molding material 110, a planarization step, such as a grinding or a CMP, is performed on the molding material 110. The planarization step is used to remove excess portions of the molding material 110, which excess portions are over top surfaces of the conductive vias 62 and the electrical connectors 108. In some embodiments, surfaces of the conductive vias 62 and surfaces of the electrical connectors 108 are exposed, and are level with a surface of the molding material 110. The electrical connectors 108 may be referred to as through molding vias (TMVs), through package vias (TPVs), and/or through integrated fan-out (InFO) vias (TIVs), and will be referred to as TIVs 108 hereinafter.

Figure 13:
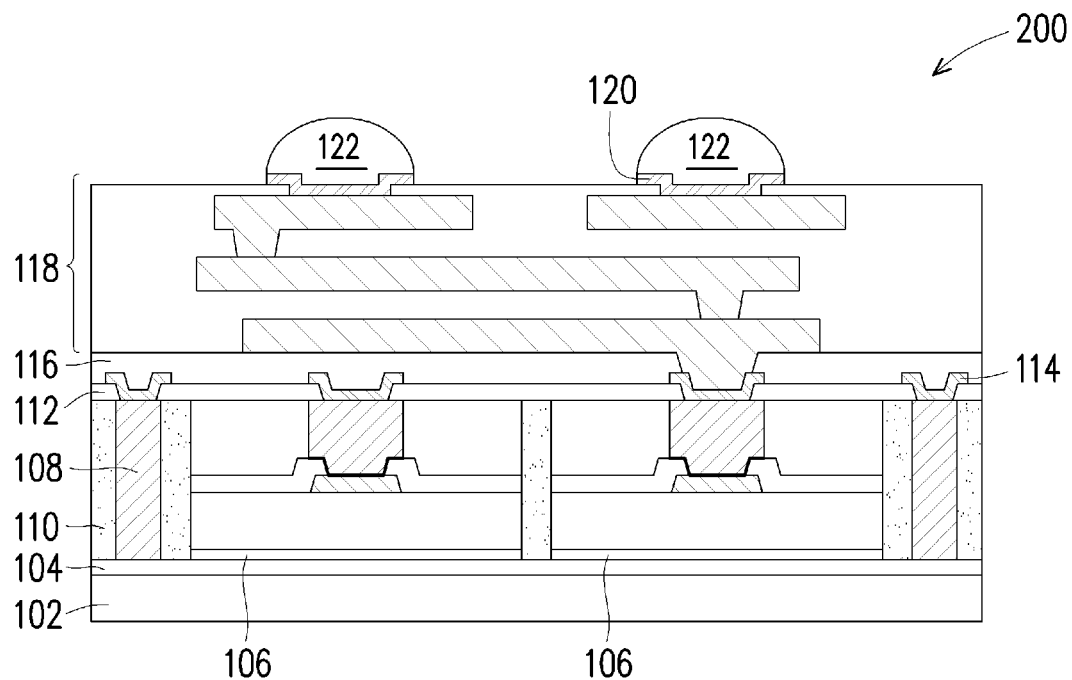

In FIG. 13, a first polymer layer 112 is formed over the dies 100, the TIVs 108, and the molding material 110. Openings are formed in the first polymer layer 112, and under bump metallurgies (UBMs) 114 are formed in the openings physically and electrically coupled to the TIVs 108 and/or the conductive feature 62. The UBMs 114 have portions over the first polymer layer 112, and contact sidewalls of the openings. A second polymer layer 116 is formed over the first polymer layer 112 and the UBMs 114.

The first polymer layer 112 and the second polymer layer 116 are formed several ways. In some embodiments, the first polymer layer 112 and/or the second polymer layer 116 comprise a polybenzoxaxole (PBO), a polyimide, an epoxy, and so on. The first polymer layer 112 and/or the second polymer layer 116 may be formed or deposited by chemical vapor deposition (CVD), spin coating, laminating, and so on. The second polymer layer 116 may be similar to the first polymer layer 112, or may be different.

The UBMs 114 may be formed by first forming the openings through the first polymer layer 112 to expose surfaces of the TIVs 108 and/or the conductive feature 62. The UBMs 114 may extend through these openings in the first polymer layer 112 and also extend along a surface of the first polymer layer 112. The UBMs 114 may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 114. Any suitable materials or layers of material that may be used for the UBMs 114 are fully intended to be included within the scope of the current application.

Further FIG. 13, a front-side redistribution structure 118 is formed on the dies 100, the TIVs 108, and the molding material 110. The front-side redistribution structure 118 includes multiple dielectric layers and metallization patterns. For example, the front-side redistribution structure 118 may be patterned as a plurality of discrete portions separated from each other by respective dielectric layer(s). The front-side redistribution structure 118 may be, e.g., redistribution layers (RDLs), and may include metal traces (or metal lines) and vias underlying and connected to the metal traces. In accordance with some embodiments of the present disclosure, the RDLs are formed through plating processes, wherein each of the RDLs includes a seed layer (not shown) and a plated metallic material over the seed layer. The seed layer and the plated metallic material may be formed of the same material or different materials.

The front-side redistribution structure 118 is shown as an example. More or fewer dielectric layers and metallization patterns than shown may be formed in the front-side redistribution structure 118. One having ordinary skill in the art will readily understand which steps and processes would be omitted or repeated to form more or fewer dielectric layers and metallization patterns.

Further in FIG. 13, UBMs 120 are formed coupled to the front-side redistribution structure 118, and conductive connectors 122 are formed coupled to the UBMs 120. The UBMs 120 may be formed by first forming a set of openings (not shown) through the topmost dielectric layer to expose surfaces of the metallization patterns in the front-side redistribution structure 118. The UBMs 120 may extend through these openings in the dielectric layer and also extend along a surface of the dielectric layer. The UBMs 120 may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 120. Any suitable materials or layers of material that may be used for the UBMs 120 are fully intended to be included within the scope of the current application.

In some embodiments, surface mount devices (SMDs) (not shown) may be formed coupled to a subset of the UBMs 120. The SMDs may be passive or active devices.

The conductive connectors 122 may be solder bumps, metal pillars, controlled collapse chip connection (C4) bumps, micro bumps, electroless nickel-electroless palladium-immersion gold technique (ENEPIG) formed bumps, or the like. The conductive connectors 122 may include a conductive material such as solder, copper, aluminum, gold, nickel, silver, palladium, tin, the like, or a combination thereof. In an embodiment in which the conductive connectors 122 are solder bumps, the conductive connectors 122 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 122 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 14:
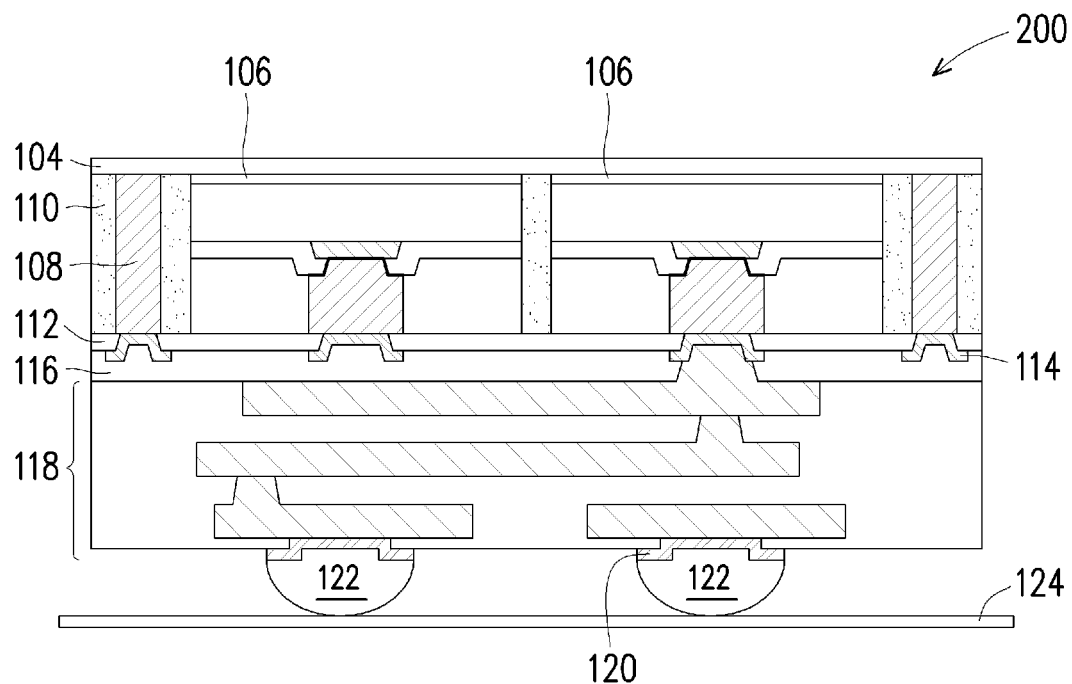

In FIG. 14, the carrier substrate 102 is de-bonded using the adhesive layer to expose the dielectric layer 104 according to an embodiment. The de-bonding is performed, for example, by projecting a UV light or a laser on the adhesive layer. For example, when the adhesive layer is formed of LTHC, the heat generated from the light or laser causes the LTHC to be decomposed, and hence the carrier substrate 102 is detached from the first device package 200. The structure is then flipped over and placed on dicing tape 124, which is fixed to a dicing frame (not shown). The dicing tape 124 is attached to the first device package 200 to protect the conductive connectors 122.

Figure 15:
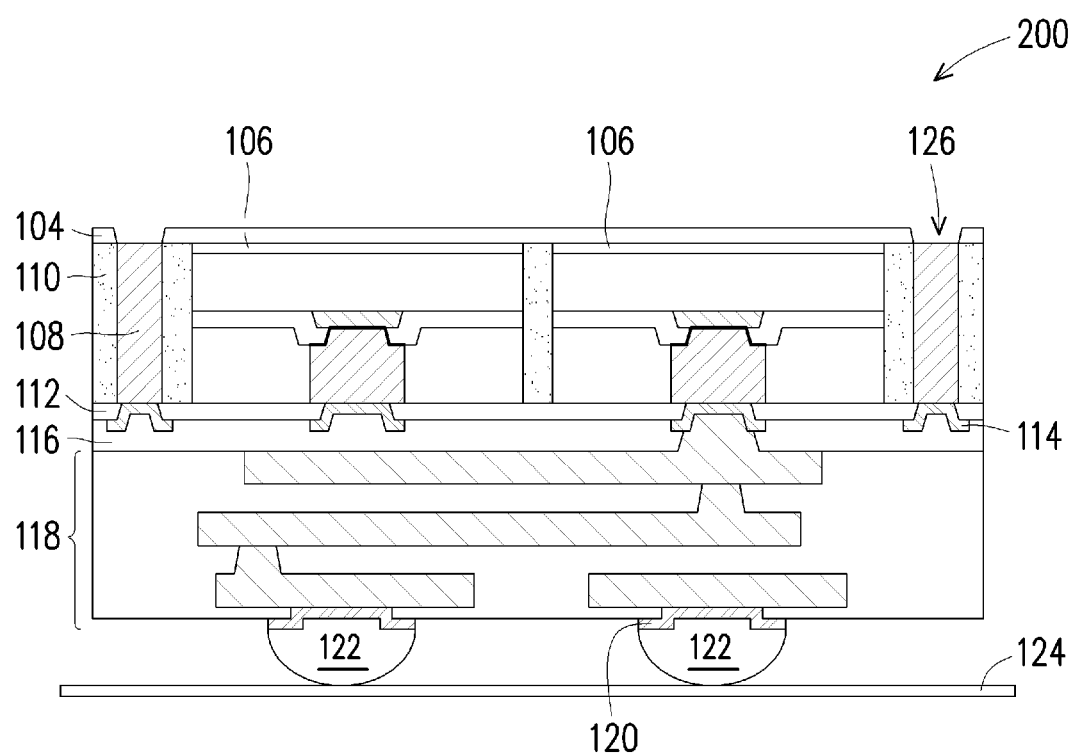

In FIG. 15, openings 126 are formed through at least a portion of the dielectric layer 104 to expose the TIVs 108 and/or portions of the conductive features in the backside redistribution structure 104. The openings 126 may be formed, for example, using laser drilling, etching, or the like.

Figure 16:
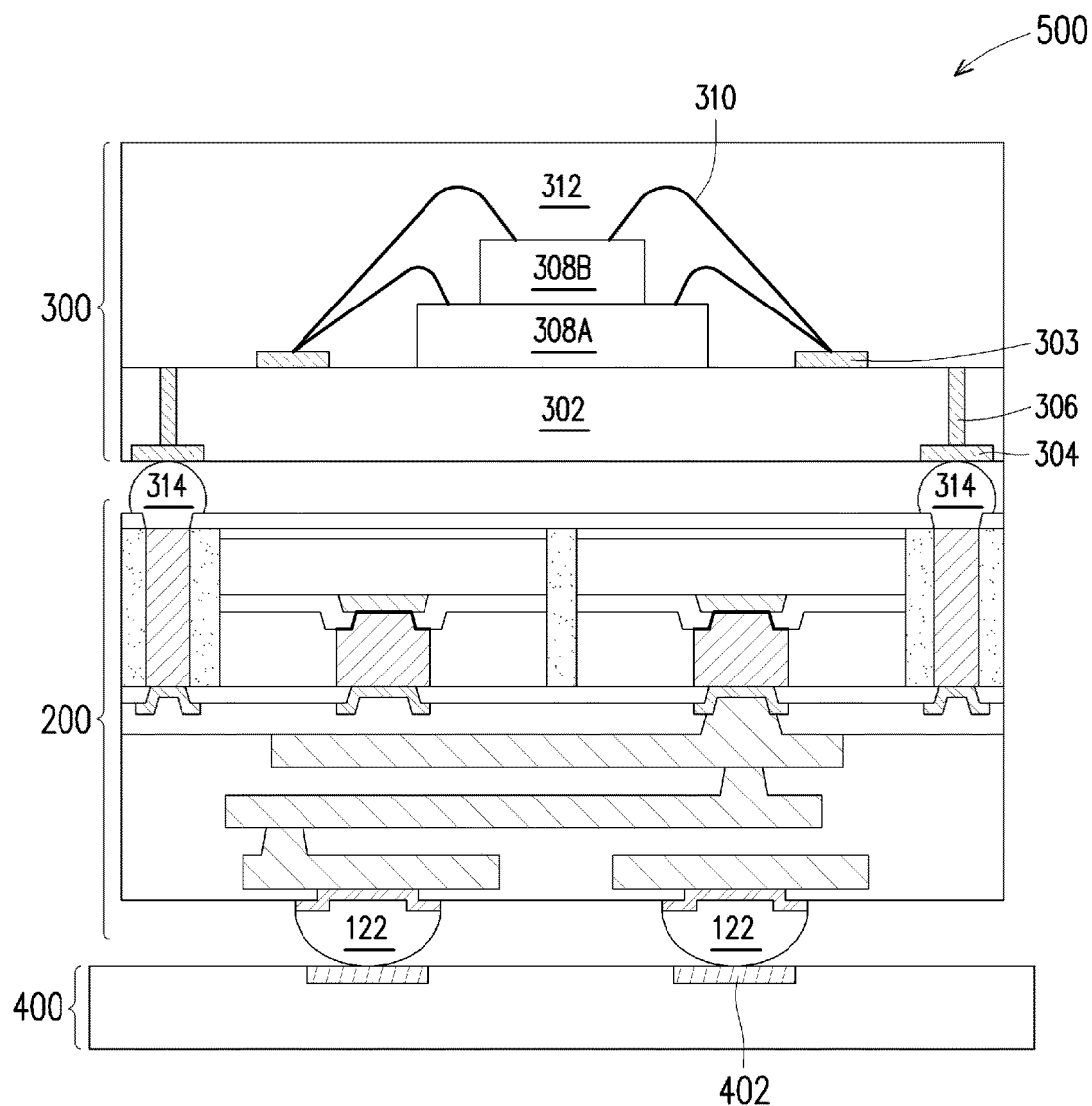
FIG. 16 is a cross-sectional view of intermediate steps during a process for forming a package structure, in accordance with some embodiments.

FIG. 16 is a cross-sectional view of intermediate steps during a process for forming a package structure 500, in accordance with some embodiments. The package structure 500 may be a package-on-package (PoP) structure.

In FIG. 16, a second device package 300 is attached to the first device package 200. The second device package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a SO) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second device package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side of the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second device packages 300.

After the second device packages 300 are formed, the second device packages 300 are bonded to the first device packages 200 by way of conductive connectors 314, the bond pads 304, the backside redistribution structure 104, and/or the TIVs 108. In some embodiments, the stacked dies 308 may be coupled to the dies 100 through the wire bonds 310, the bond pads 303 and 304, through vias 306, the conductive connectors 314, and the TIVs 108.

The conductive connectors 314 may be similar to the conductive connectors 122 described above and the description is not repeated herein, although the conductive connectors 314 and 122 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the backside redistribution structure 104. The conductive connectors 314 are formed in the openings 126.

In some embodiments, the conductive connectors 314 may have an epoxy flux (not shown) formed thereon before they are reflowed with at least some of the epoxy portion of the epoxy flux remaining after the second device package 300 is attached to the first device package 200. This remaining epoxy portion may act as an underfill to reduce stress and protect the joints resulting from the reflowing the conductive connectors 314. In some embodiments, an underfill (not shown) may be formed between the second device package 300 and the first device package 200 and surrounding the conductive connectors 314. The underfill may be formed by a capillary flow process after the second device package 300 is attached or may be formed by a suitable deposition method before the second device package 300 is attached.

The bonding between the second device package 300 and the first device package 200 may be a solder bonding or a direct metal-to-metal (such as a copper-to-copper or tin-to-tin) bonding. In an embodiment, the second device package 300 is bonded to the first device package 200 by a reflow process. During this reflow process, the conductive connectors 314 are in contact with the bond pads 304 and the backside redistribution structure 104 to physically and electrically couple the second device package 300 to the first device package 200. After the bonding process, an IMC (not shown) may form at the interface of the backside redistribution structure 104 and the conductive connectors 314 and also at the interface between the conductive connectors 314 and the bond pads 304 (not shown).

Further in FIG. 16, the first device package 200 and the second device package 300 are attached to a substrate 400 by mounting the first device package 200 to the substrate 400. The substrate 400 may be referred to a package substrate 400. The first device package 200 is mounted to the package substrate 400 using the conductive connectors 122.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 122 can be reflowed to attach the first device package 200 to the bond pads 402. The conductive connectors 122 electrically and/or physically couple the substrate 400, including metallization layers in the substrate 400, to the first device package 200.

The conductive connectors 122 may have an epoxy flux (not shown) formed thereon before they are reflowed with at least some of the epoxy portion of the epoxy flux remaining after the first device package 200 is attached to the substrate 400. This remaining epoxy portion may act as an underfill to reduce stress and protect the joints resulting from the reflowing the conductive connectors 122. In some embodiments, an underfill (not shown) may be formed between the first device package 200 and the substrate 400 and surrounding the conductive connectors 122. The underfill may be formed by a capillary flow process after the first device package 200 is attached or may be formed by a suitable deposition method before the first device package 200 is attached.

Figure 17:
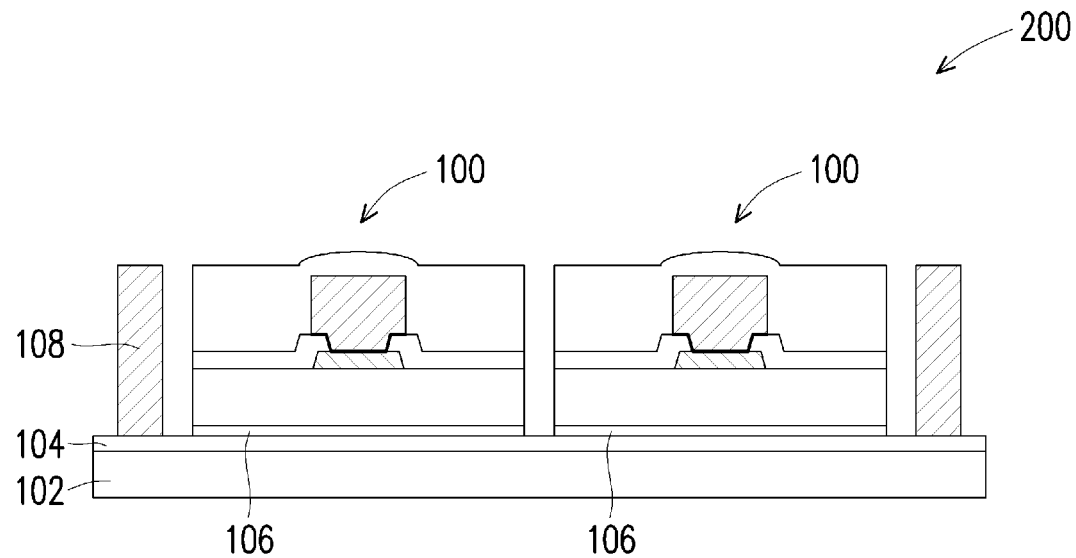
FIGS. 17 through 18 are cross-sectional views of intermediate steps during a process for forming a first device package, in accordance with other embodiments.
Figure 18:
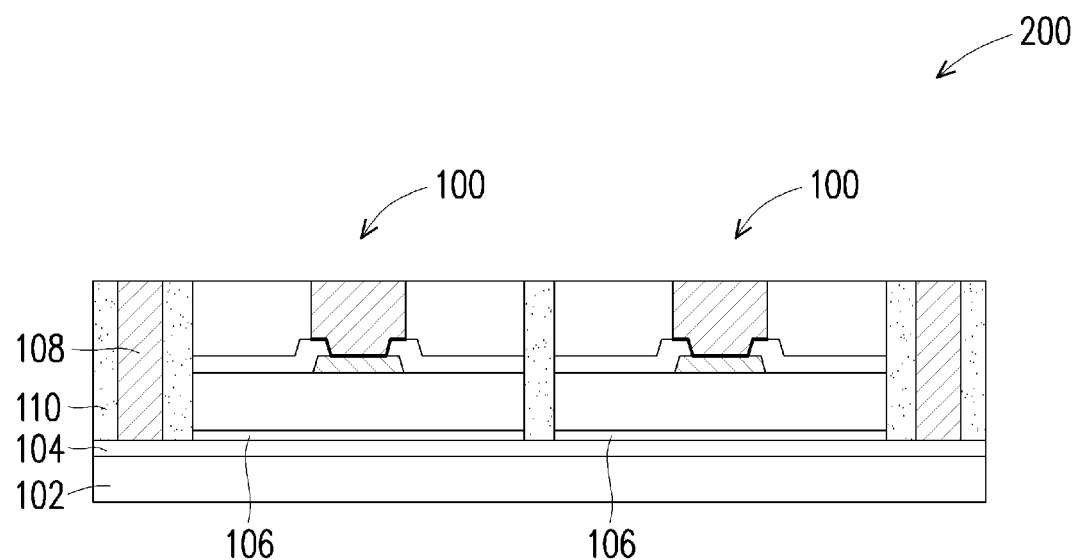

FIGS. 17 through 18 are cross-sectional views of intermediate steps during a process for forming the first device package 200, in accordance with other embodiments. In the embodiment shown in FIGS. 17 through 18, the dies 100 are processed using the process flow described above in FIGS. 1 through 8. The planarization step 72 (shown in FIG. 9) is omitted. As such, the dies 100 have the dielectric material 70 over the conductive feature 62. In FIG. 17, the dies 100 with the excess dielectric material 70 are adhered to the dielectric layer 104. After placement of the dies 100, the top surfaces of the dielectric material 70 and the electrical connectors 108 are higher than the top surfaces of the conductive features 62. In FIG. 18, the dies 100 and the electrical connectors 108 are encapsulated with the molding material 110. A planarization step, such as a grinding or a CMP, is performed on the molding material 110, the dies 100, and the electrical connectors 108. The planarization step removes the excess portions of the dielectric material 70 over the conductive feature 62. After the planarization step, top surfaces of the electrical connectors 108, the molding material 110, the dielectric material 70, and the conductive features 62 are level. Processing of the first device package 200 may then be continued using the process flow shown in FIGS. 13 through 16.

Some embodiments may achieve advantages. As devices continue to shrink in size, removing solder caps with nitric-based etchants may reduce warpage caused by high-temperature solder removal operations, and may increase the process window size for subsequent grinding operations. Cleaning the conductive posts may reduce delamination that occurs when the conductive posts are encapsulated, and may increase the adhesion between the conductive posts and the encapsulant. As a result, processing that occurs after the testing of the devices may have a higher yield rate.

An embodiment includes a method. The method includes forming a conductive post on a die; coupling a test probe to the conductive post with solder; and etching the solder and the conductive post with a plurality of etching processes, the plurality of etching processes including a first etching process, the first etching process comprising etching the conductive post with a nitric-based etchant.

An embodiment includes a method. The method includes coupling a test probe to a conductive post with a solder; after coupling the test probe, removing the test probe from the conductive post; and after removing the test probe, removing remaining portions of the solder from the conductive post with an etching process, the etching process including etching the solder with a nitric-based etchant.

An embodiment includes a method. The method includes forming a copper pillar on a die; forming a solder ball on the copper pillar; reflowing the solder ball to form a solder connection, the solder connection contacting sidewalls of the copper pillar and coupling a test probe to a top surface of the copper pillar; testing the die with the test probe; and etching the top surface and the sidewalls of the copper pillar with a nitric-based etchant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a conductive post on a die;
   coupling a test probe to the conductive post with solder; and
   etching the solder and the conductive post with a first etching process, the first etching process comprising etching the solder and the conductive post with a same nitric-based etchant such that the conductive post forms no salt or less salt than the solder.

2. The method of claim 1, wherein the solder contacts a top surface and sidewalls of the conductive post before the etching.

3. The method of claim 2, wherein etching the solder and the conductive post removes the solder from the top surface and the sidewalls of the conductive post.

4. The method of claim 1, further comprising:
   testing the die after coupling the test probe to the conductive post.

5. The method of claim 4, wherein the etching is performed after the testing.

6. The method of claim 1, further comprising:
   after etching the solder and the conductive post, forming a dielectric over the die, the dielectric contacting sidewalls of the conductive post.

7. The method of claim 6, further comprising:
   placing the die on a carrier substrate;
   forming a via on the carrier substrate adjacent the die; and
   encapsulating the die and the via with a molding compound.

8. The method of claim 7, further comprising:
   forming redistribution layers over the die and the via; and
   forming external contacts on the redistribution layers.

9. The method of claim 1, wherein the solder and the conductive post are formed of different materials.

10. A method comprising:
    coupling a test probe to a conductive post with a solder;
    after coupling the test probe, removing the test probe from the conductive post;
    after removing the test probe, removing remaining portions of the solder from the conductive post with an etching process, the etching process including etching the solder with a nitric-based etchant comprising an ion of a transitional metal, and the etching the solder comprising etching the solder from sidewalls and a top surface of the conductive post; and
    after removing the remaining portions of the solder from the conductive post, forming a dielectric material on the etched sidewalls and top surface of the conductive post.

11. The method of claim 10, wherein etching the solder with the nitric-based etchant cleans the conductive post.

12. The method of claim 10, wherein the conductive post is a copper pillar.

13. The method of claim 10, the etching process including etching the solder with the nitric-based etchant comprising the ion of a transitional metal such that the conductive post forms no salt or less salt than the solder.

14. A method comprising:
    forming a copper pillar on a die;

forming a solder ball on the copper pillar;

reflowing the solder ball to form a solder connection, the solder connection contacting sidewalls of the copper pillar and coupling a test probe to a top surface of the copper pillar;

testing the die with the test probe; and etching the top surface and the side ails of the copper pillar with a nitric-base etchant to remove the solder ball contacting the sidewalls of the copper pillar.

15. The method of claim 14, wherein etching the top surface and the sidewalls of the copper pillar comprises performing a plurality of etching steps on the copper pillar with a plurality of etchants, at least one of the plurality of etchants being a nitric-based etchant.

16. The method of claim 14, further comprising:

forming a dielectric material on the etched sidewalls and the top surface of the copper pillar.

17. The method of claim 16, further comprising:

planarizing the dielectric material until the top surface of the copper pillar is level with a top surface of the dielectric material.

18. The method of claim 14, wherein etching the top surface and the sidewalls of the copper pillar removes the solder connection and decouples the test probe from the copper pillar.

19. The method of claim 14, further comprising:

placing the die on a carrier substrate;

forming a via adjacent the die; and encapsulating the die and the via on the carrier substrate.

20. The method of claim 19, further comprising:

forming redistribution layers over the die and the via; and forming external contacts on the redistribution layers.

21. The method of claim 14, further comprising:

after the etching, forming a dielectric material on the etched sidewalls and the top surface of the copper pillar, wherein at least a portion of a bottom surface of the dielectric material is below the top surface of the copper pillar.

* * * * *